United States Patent
Niizeki et al.

(10) Patent No.: US 12,537,171 B2
(45) Date of Patent: Jan. 27, 2026

(54) SUBSTRATE PROCESSING METHOD AND SUBSTRATE PROCESSING APPARATUS

(71) Applicant: Tokyo Electron Limited, Tokyo (JP)

(72) Inventors: Tomohiko Niizeki, Tokyo (JP); Maju Tomura, Miyagi (JP); Yoshihide Kihara, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 315 days.

(21) Appl. No.: 18/200,910

(22) Filed: May 23, 2023

(65) Prior Publication Data

US 2023/0386800 A1 Nov. 30, 2023

(30) Foreign Application Priority Data

May 25, 2022 (JP) .................................. 2022-085462

(51) Int. Cl.
*H01J 37/32* (2006.01)
(52) U.S. Cl.
CPC .. *H01J 37/32669* (2013.01); *H01J 37/32568* (2013.01); *H01J 2237/334* (2013.01)
(58) Field of Classification Search
None
See application file for complete search history.

(56) References Cited

U.S. PATENT DOCUMENTS

| | | | |
|---|---|---|---|
| 6,113,731 A * | 9/2000 | Shan | H01L 21/68735 156/345.46 |
| 6,853,141 B2 * | 2/2005 | Hoffman | H01J 37/32091 315/111.41 |
| 2011/0056912 A1 * | 3/2011 | Matsuyama | H01J 37/32623 427/571 |
| 2014/0206199 A1 * | 7/2014 | Himori | H01J 37/32669 438/717 |
| 2014/0346040 A1 * | 11/2014 | Yokota | C23C 14/35 204/298.37 |

FOREIGN PATENT DOCUMENTS

| | | |
|---|---|---|
| JP | 2013-149722 A | 8/2013 |
| JP | 2014-158005 A | 8/2014 |

* cited by examiner

*Primary Examiner* — Allan W. Olsen
(74) *Attorney, Agent, or Firm* — XSENSUS LLP

(57) ABSTRACT

A substrate processing method includes: providing a substrate processing apparatus including a chamber, a substrate support that supports a substrate in the chamber, an upper electrode facing a center of the substrate, and a plurality of electromagnets arranged radially around the center of the upper electrode; selecting a polarity modification pattern to be used for the plurality of electromagnets during an etching; and generating plasma from a processing gas supplied into the chamber, and etching the substrate based on the polarity modification pattern.

15 Claims, 6 Drawing Sheets

SUBSTRATE PROCESSING METHOD AND SUBSTRATE PROCESSING APPARATUS

CROSS-REFERENCE TO RELATED APPLICATIONS

This application is based on and claims priority from Japanese Patent Application No. 2022-085462, filed on May 25, 2022, with the Japan Patent Office, the disclosure of which is incorporated herein in its entirety by reference.

TECHNICAL FIELD

The present disclosure relates to a substrate processing method and a substrate processing apparatus.

BACKGROUND

Conventionally, it is known to control the ions (charged particles) and neutral etchant (cold radicals) during a high aspect ratio etching on a film formed on a substrate, for the sake of obtaining a vertical shape of a sidewall. Further, in order to easily change the distribution of plasma density in a processing space, it has been proposed to arrange electromagnets outside an upper electrode, and control the magnetic poles of the electromagnets (Japanese Patent Laid-Open Publication No. 2013-149722).

SUMMARY

According to an aspect of the present disclosure, a substrate processing method includes: providing a substrate processing apparatus including a chamber, a substrate support configured to support a substrate in the chamber, an upper electrode facing a center of the substrate, and a plurality of electromagnets arranged radially around the center of the upper electrode; selecting a polarity modification pattern to be used for the plurality of electromagnets during an etching; and generating plasma from a processing gas supplied into the chamber, and etching the substrate based on the polarity modification pattern.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, embodiments of a substrate processing method and a substrate processing apparatus according to the present disclosure will be described in detail based on the drawings. The present disclosure is not limited to the embodiments.

As described above, in a case where ions and neutral etchant are controlled to obtain the vertical sidewall shape, the ions have contributed to forming a rectangular bottom (Btm) shape by a control to narrow the distribution of an incident angle (ion angular distribution). Further, the neutral etchant has contributed to expanding the bottom CD in combination with a sidewall protecting gas. However, when an even higher aspect ratio is required, ions reflected from a mask are incident intensively on the sidewall in the diagonal direction, and as a result, uneven CD-expanded areas, that is, bowing ($1^{st}$, $2^{nd}$) may be formed. The uneven CD-expanded areas start to appear after the middle of etching during which a hard mask begins to exhibit the facet shape as the etching progresses. Therefore, there is a demand to suppress the formation of uneven CD-expanded areas even after the middle of etching.

[Configuration of Substrate Processing System]

Figure 1:
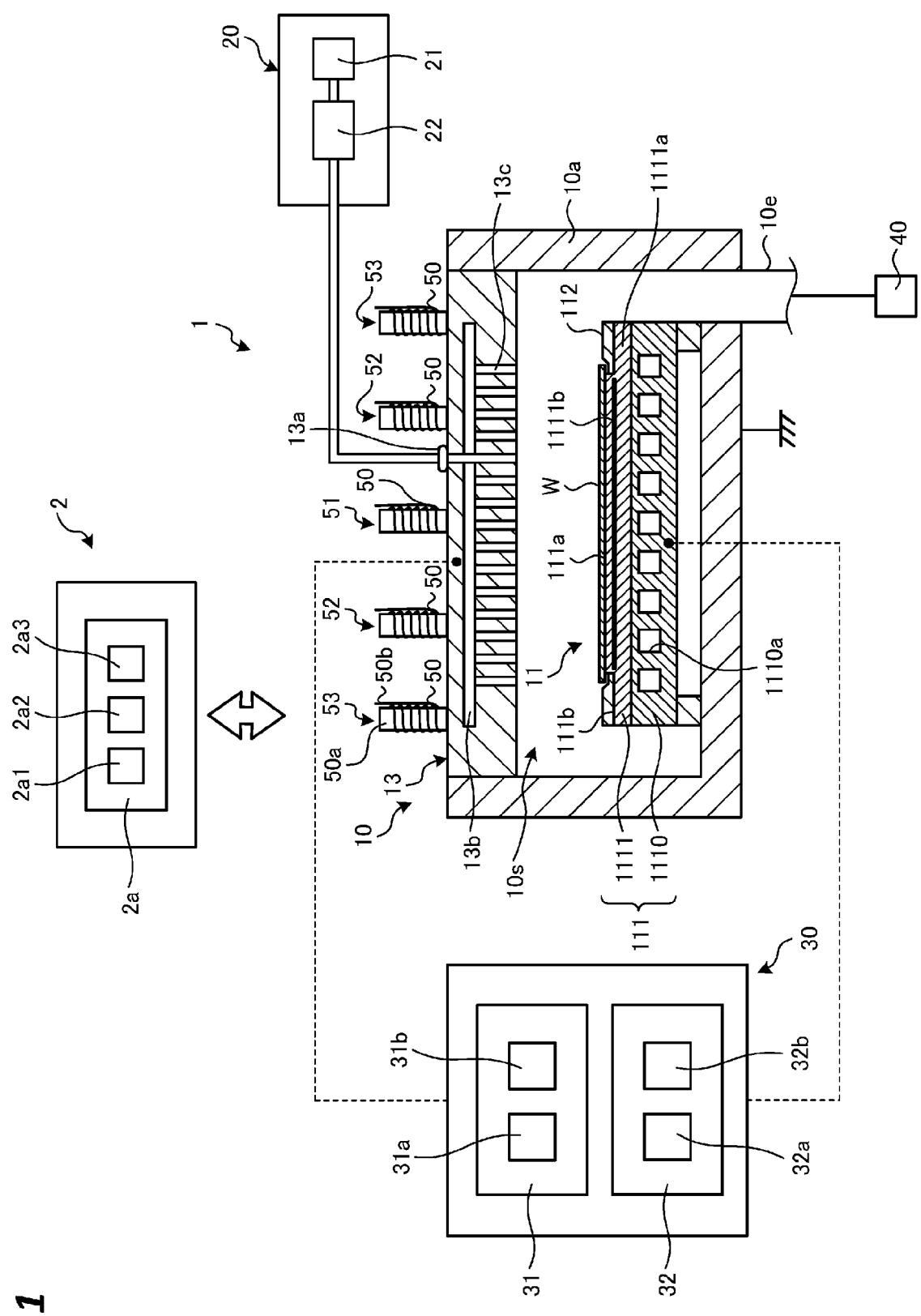
FIG. 1 is a view illustrating an example of a plasma processing system according to an embodiment of the present disclosure.

Hereinafter, a configuration of a plasma processing system will be described. FIG. 1 is a view illustrating an example of a plasma processing system according to an embodiment of the present disclosure. As illustrated in FIG. 1, the plasma processing system includes a capacitively coupled plasma processing apparatus 1 and a control unit 2. The capacitively coupled plasma processing apparatus 1 includes a plasma processing chamber 10, a gas supply unit 20, a power supply 30, and an exhaust system 40. Further, the plasma processing apparatus 1 includes a substrate support 11 and a gas introduction unit. The gas introduction unit is configured to introduce at least one processing gas into the plasma processing chamber 10. The gas introduction unit includes a shower head 13. The substrate support 11 is disposed inside the plasma processing chamber 10. The shower head 13 is disposed above the substrate support 11. In an embodiment, the shower head 13 makes up at least a portion of the ceiling of the plasma processing chamber 10. The plasma processing chamber 10 has a plasma processing space 10s defined by the shower head 13, the sidewall 10a of the plasma processing chamber 10, and the substrate support 11. The plasma processing chamber includes at least one gas supply port for supplying at least one processing gas into the plasma processing space 10s, and at least one gas discharge port for discharging a gas from the plasma processing space 10s. The plasma processing chamber 10 is grounded. The shower head 13 and the substrate support 11 are electrically insulated from the housing of the plasma processing chamber 10.

The substrate support 11 includes a main body 111 and a ring assembly 112. The main body 111 has a central region 111a for supporting a substrate W, and an annular region 111b for supporting the ring assembly 112. A wafer is an example of the substrate W. The annular region 111b of the main body 111 surrounds the central region 111a of the main body 111 in plan view. The substrate W is placed on the central region 111a of the main body 111, and the ring assembly 112 is disposed on the annular region 111b of the main body 111 to surround the substrate W placed on the central region 111a of the main body 111. Accordingly, the central region 111a is also referred to as a substrate support surface for supporting the substrate W thereon, and the annular region 111b is also referred to as a ring support surface for supporting the ring assembly 112 thereon.

In an embodiment, the main body 111 includes a base 1110 and an electrostatic chuck 1111. The base 1110 includes a conductive member. The conductive member of the base 1110 may function as a lower electrode. The electrostatic chuck 1111 is disposed on the base 1110. The electrostatic chuck 1111 includes a ceramic member 1111a and an electrostatic electrode 1111b disposed inside the ceramic member 1111a. The ceramic member 1111a has the central region 111a. In an embodiment, the ceramic member 1111a also has the annular region 111b. Another member surrounding the electrostatic chuck 1111, such as an annular electrostatic chuck or an annular insulating member, may have the annular region 111b. In this case, the ring assembly 112 may be disposed on the annular electrostatic chuck or the annular insulating member, or may be disposed on both the electrostatic chuck 1111 and the annular insulating member. Further, at least one RF/DC electrode may be disposed inside the ceramic member 1111a, to be coupled to a radio-frequency (RF) power supply 31 and/or a direct current (DC) power supply 32, which will be described later. In this case, the at least one RF/DC electrode functions as a lower electrode. When a bias RF signal and/or a DC signal to be described later is supplied to the at least one RF/DC electrode, the RF/DC electrode is also referenced as a bias electrode. Further, the conductive member of the base 1110 and the at least one RF/DC electrode may function as a plurality of lower electrodes. The electrostatic electrode 1111b may function as a lower electrode. Thus, the substrate support 11 includes at least one lower electrode.

The ring assembly 112 includes one or more annular members. In an embodiment, the one or more annular members include one or more edge rings and at least one cover ring. The edge ring is made of a conductive material or an insulating material, and the cover ring is made of an insulating material.

The substrate support 11 may include a temperature adjustment module configured to adjust at least one of the electrostatic chuck 1111, the ring assembly 112, and the substrate to a target temperature. The temperature adjustment module may include a heater, a heat transfer medium, a flow path 1110a, or a combination thereof. A heat transfer fluid such as brine and a gas flows in the flow path 1110a. In an embodiment, the flow path 1110a is formed inside the base 1110, and one or a plurality of heaters is disposed inside the ceramic member 1111a of the electrostatic chuck 1111. The substrate support 11 may include a heat transfer gas supply unit configured to supply a heat transfer gas to the gap between the back surface of the substrate W and the central region 111a.

The shower head 13 is configured to introduce at least one processing gas from the gas supply unit 20 into the plasma processing space 10s. The shower head 13 has at least one gas supply port 13a, at least one gas diffusion chamber 13b, and a plurality of gas introduction ports 13c. The processing gas supplied to the gas supply port 13a passes through the gas diffusion chamber 13b and is introduced into the plasma processing space 10s from the plurality of gas introduction ports 13c. Further, the shower head 13 includes at least one upper electrode. The gas introduction unit may include one or a plurality of side gas injectors (SGI) attached to one or a plurality of openings formed in the sidewall 10a, in addition to the shower head 13.

The gas supply unit 20 may include at least one gas source 21 and at least one flow rate controller 22. In an embodiment, the gas supply unit 20 is configured to supply at least one processing gas from its corresponding gas source 21 to the shower head 13 via its corresponding flow rate controller 22. The flow rate controller 22 may include, for example, a mass flow controller or a pressure-controlled flow rate controller. The gas supply unit 20 may further include at least one flow rate modulation device that modulates or pulses the flow rate of at least one processing gas.

The power supply 30 includes an RF power supply 31 coupled to the plasma processing chamber 10 via at least one impedance matching circuit. The RF power supply 31 is configured to supply at least one RF signal (RF power) to at least one lower electrode and/or at least one upper electrode. As a result, plasma is formed from at least one processing gas supplied into the plasma processing space 10s. Accordingly, the RF power supply 31 may function as at least a portion of a plasma generation unit configured to generate plasma from one or more processing gases in the plasma processing chamber 10. By supplying a bias RF signal to at least one lower electrode, a bias potential is generated in the substrate W so that ion components in formed plasma may be attracted to the substrate W.

In an embodiment, the RF power supply 31 includes a first RF generation unit 31a and a second RF generation unit 31b. The first RF generation unit 31a is coupled to at least one lower electrode and/or at least one upper electrode via at least one impedance matching circuit, and configured to generate a source RF signal (source RF power) for generating plasma. In an embodiment, the source RF signal has a frequency in the range of 10 MHz to 150 MHz. In an embodiment, the first RF generation unit 31a may be configured to generate a plurality of source RF signals having different frequencies. One or a plurality of generated source RF signals is supplied to at least one lower electrode and/or at least one upper electrode.

The second RF generation unit 31b is coupled to at least one lower electrode via at least one impedance matching circuit, and configured to generate a bias RF signal (bias RF power). The frequency of the bias RF signal may be the same as or different from the frequency of the source RF signal. In an embodiment, the bias RF signal has a frequency lower than that of the source RF signal. In an embodiment, the bias RF signal has a frequency in the range of 100 kHz to 60 MHz. In an embodiment, the second RF generation unit 31b may be configured to generate a plurality of bias RF signals having different frequencies. One or a plurality of generated bias RF signals is supplied to at least one lower electrode. In various embodiments, at least one of the source RF signal and the bias RF signal may be pulsed.

The power supply 30 may further include a DC power supply 32 coupled to the plasma processing chamber 10. The DC power supply 32 includes a first DC generation unit 32a and a second DC generation unit 32b. In an embodiment, the first DC generation unit 32a is connected to at least one lower electrode, and configured to generate a first DC signal. The generated first bias DC signal is applied to at least one lower electrode. In an embodiment, the second DC generation unit 32b is connected to at least one upper electrode, and configured to generate a second DC signal. The generated second DC signal is applied to at least one upper electrode.

In various embodiments, at least one of the first and second DC signals may be pulsed. In this case, a sequence of voltage pulses is applied to at least one lower electrode and/or at least one upper electrode. The voltage pulses may have rectangular, trapezoidal or triangular pulse waveforms, or combined pulse waveforms thereof. In an embodiment, a waveform generation unit is connected between the first DC generation unit 32a and at least one lower electrode, to generate a sequence of voltage pulses from a DC signal. Thus, the first DC generation unit 32a and the waveform generation unit make up a voltage pulse generation unit. When the second DC generation unit 32b and the waveform generation unit make up the voltage pulse generation unit, the voltage pulse generation unit is connected to at least one upper electrode. The voltage pulse may have a positive polarity or a negative polarity. The sequence of voltage pulses may include one or a plurality of positive voltage pulses and one or a plurality of negative voltage pulses in one cycle. The first and second DC generation units 32a and 32b may be provided in addition to the RF power supply 31, and the first DC generation unit 32a may be provided in place of the second RF generation unit 31b.

The exhaust system 40 may be connected to a gas outlet 10e provided at, for example, the bottom of the plasma processing chamber 10. The exhaust system 40 may include a pressure regulation valve and a vacuum pump. The pressure in the plasma processing space 10s is regulated by the pressure regulation valve. The vacuum pump may include a turbo molecular pump, a dry pump, or a combination thereof.

A plurality of electromagnets 50 is arranged substantially radially on the upper surface of the shower head 13, including the upper electrode, which is opposite to the plasma processing space 10s. Each electromagnet 50 has a rod-like yoke 50a made of an iron core, and a coil 50b made of a conductive wire wound around the side surface of the yoke 50a and drawn out at both ends thereof. In the electromagnet 50, a value or direction of current flowing to the coil 50b is controlled by a controller (not illustrated), so that the total magnetic flux generated by the electromagnet 50 or the direction of the magnetic flux may be arbitrarily modified. Further, in the initial stage of etching, the electromagnet 50 is controlled not to generate a magnetic field, allowing the flow of current for eliminating a bias magnetic field by the hysteresis of the yoke 50a.

The plurality of electromagnets 50 are classified into, for example, a central facing group 51, a peripheral facing group 52, and an outer facing group 53. The central facing group 51 includes an electromagnet 50 facing the center of the substrate W. The peripheral facing group 52 includes a plurality of electromagnets 50 arranged annularly around the center of the shower head 13 (the upper electrode) that faces the center of the substrate W, and facing the peripheral edge of the substrate W. The outer facing group 53 includes a plurality of electromagnets 50 arranged annularly around the center of the shower head 13 (the upper electrode), and disposed outside the peripheral facing group 52 not to face the substrate W. A plurality of electromagnets 50 may be disposed between the central facing group 51 and the peripheral facing group 52, and between the peripheral facing group 52 and the outer facing group 53. The central facing group 51 may include a plurality of electromagnets 50.

In the plasma processing apparatus 1, for example, the direction of current flowing to the coil 50b of each electromagnet 50 of the peripheral facing group 52 is controlled, such that all of the magnetic poles of the respective electromagnets 50 on the side of the plasma processing space 10s become the same. Further, for example, the direction of current flowing to the coil 50b of each electromagnet 50 of the outer facing group 53 is controlled such that all of the magnetic poles of the respective electromagnets on the side of the plasma processing space 10s become the same. Further, in the plasma processing apparatus 1, for example, a control is performed to modify polarities of electromagnets 50 in a set of adjacent electromagnets 50 or a set of multiple electromagnets 50 adjacent to one electromagnet 50, during an etching process based on a selected polarity modification pattern.

The control unit 2 processes computer executable commands to cause the plasma processing apparatus 1 to perform various processes described in the present disclosure. The control unit 2 may be configured to control each component of the plasma processing apparatus 1 to perform the various processes described herein below. In an embodiment, the control unit 2 may be partially or entirely included in the plasma processing apparatus 1. The control unit 2 may include a processing unit 2a1, a storage unit 2a2, and a communication interface 2a3. The control unit 2 is implemented by, for example, a computer 2a. The processing unit 2a1 may be configured to perform various control operations by reading programs from the storage unit 2a2 and executing the read programs. The programs may be stored in the storage unit 2a2 in advance, or may be acquired via a medium when necessary. The acquired programs are stored in the storage unit 2a2, and read from the storage unit 2a2 to be executed by the processing unit 2a1. The medium may be any of various storage media readable by the computer 2a, or may be a communication line connected to the communication interface 2a3. The processing unit 2a1 may be a central processing unit (CPU). The storage unit 2a2 may include a random access memory (RAM), a read only memory (ROM), a hard disk drive (HDD), a solid state drive (SSD), or a combination thereof. The communication interface 2a3 may communicate with the plasma processing apparatus 1 via a communication line such as a local area network (LAN).

[Elements for Forming Vertical Sidewall Shape]

Figure 2:
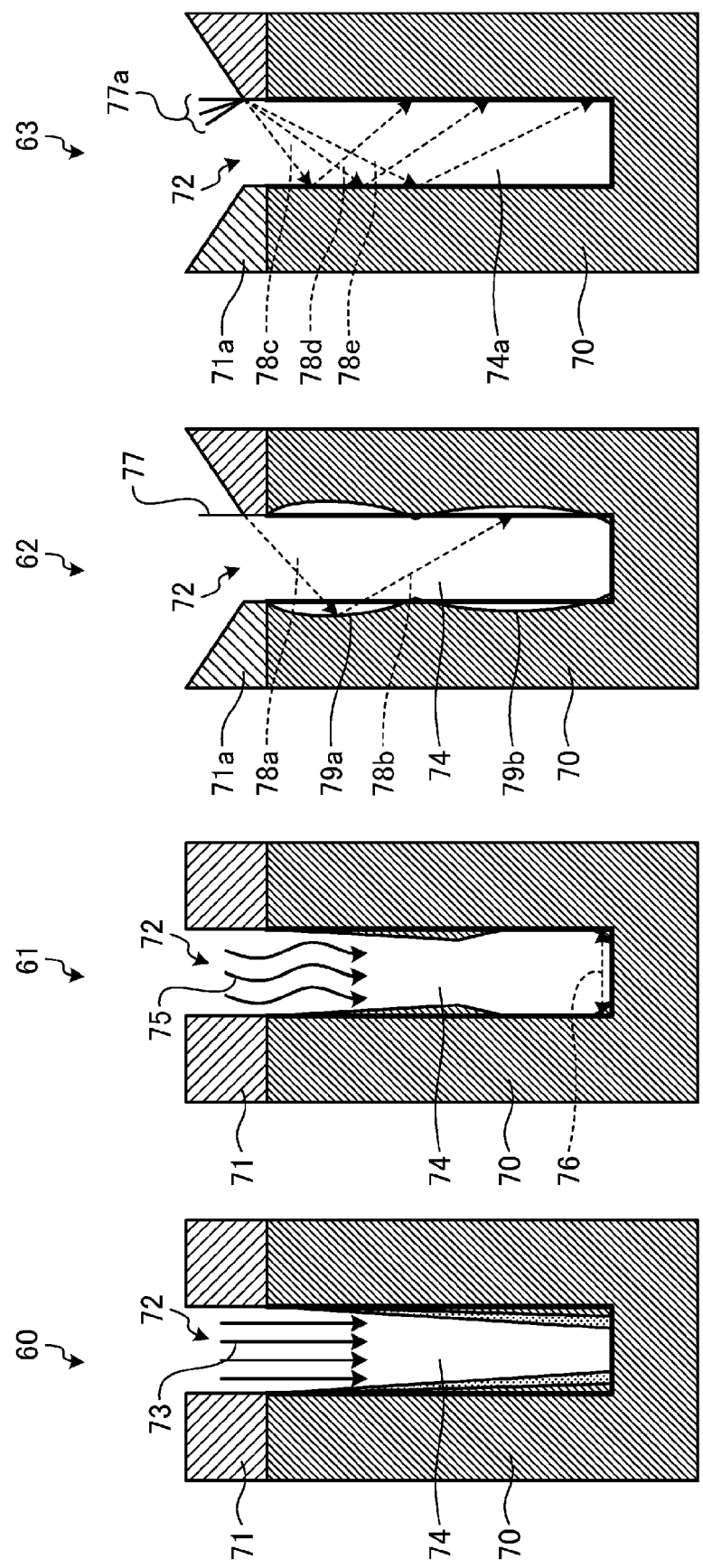
FIG. 2 is a view illustrating an example of elements for forming a vertical sidewall shape.

Here, descriptions will be made on elements for forming a vertical sidewall shape in a high aspect ratio (HAR) etching, using FIG. 2. FIG. 2 is a view illustrating an example of the elements for forming the vertical sidewall shape. States 60 to 62 illustrated in FIG. 2 represent the state changes of the sidewall of a hole, in a case where ions and neutral etchant are controlled in the related art. State 63 represents the state change of the sidewall of a hole in a case where the normal direction of ions is caused to precess in the embodiment of the present disclosure.

The state 60 represents a state where the shape of a hole 74 is gradually changed from a tapered shape to a vertical shape by ions 73 having a high ion energy (Ei) and ion flux (Γi), during an etching on an etching target film 70 through an opening 72 defined by a mask 71. The state 61 represents a state where the bottom CD 76 is enlarged by an over etching (OE) using neutral etchant 75 while protecting the sidewall of the hole 74. The state 62 represents a state where ions 77 are reflected from a mask 71a having a facet shape as the etching progresses, and incident intensively on the sidewall of the hole 74 in the diagonal direction as indicated by trajectories 78a and 78b, resulting in forming discrete CD-expanded areas (bows) 79a and 79b in the depth direction.

Meanwhile, in the state 63, the incident angle of ions 77a varies by the precession of the normal direction, and therefore, the ions 77a even reflected from the mask 71a are not incident intensively on a specific portion of the sidewall of a hole 74a as indicated by trajectories 78c to 78e. Thus, the formation of CD-expanded areas at the sidewall of the hole 74a may be suppressed. In the present embodiment, as represented in the state 63, the normal direction of the ions 77a is caused to precess by the magnetic field of the electromagnets 50, thereby suppressing the formation of CD-expanded areas.

[Distribution and Control of Electron Density]

Figure 3:
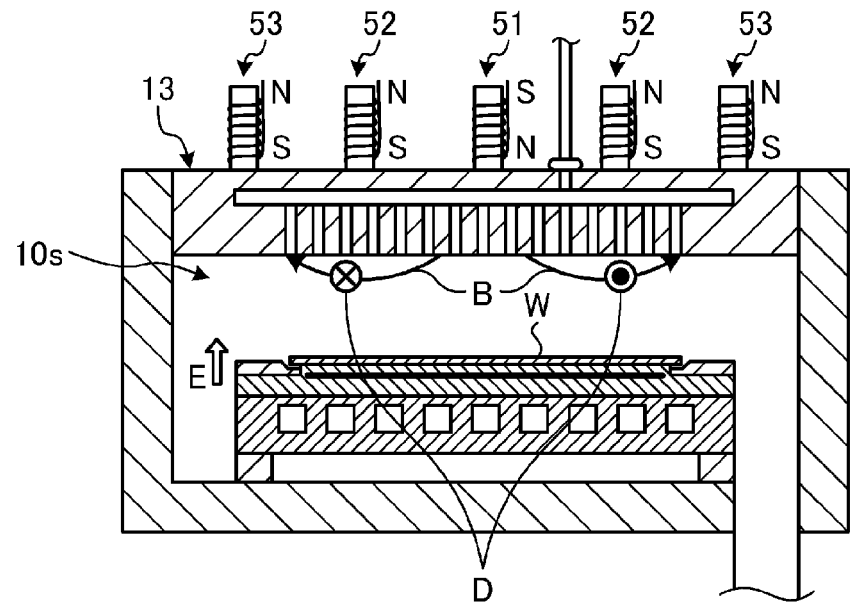
FIG. 3 is a view illustrating an example of a magnetic field generated in a plasma processing space.
Figure 4:
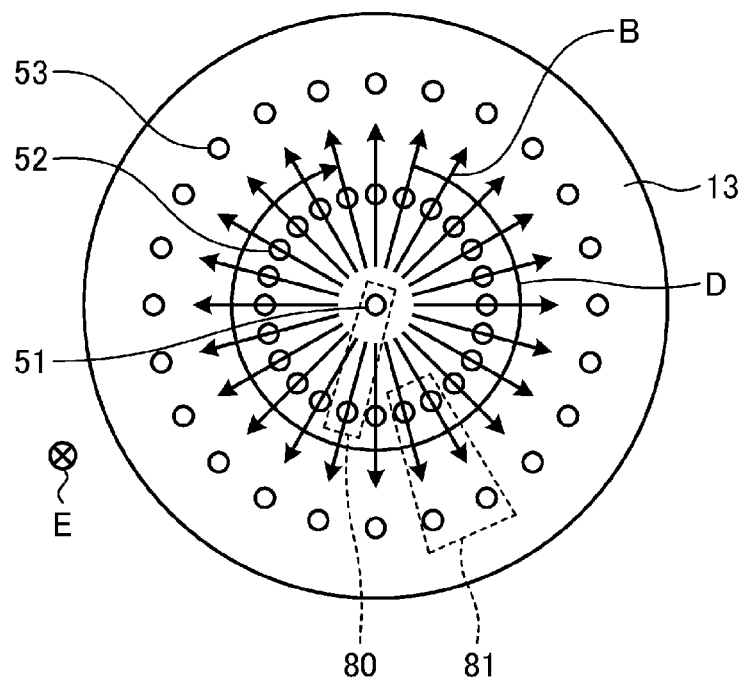
FIG. 4 is a view illustrating an example of each set of electromagnets to be subjected to a polarity modification, when viewed from the lower surface of a shower head.

Next, descriptions will be made on the distribution and control of electron density (Ne) in the plasma processing space 10s, using FIGS. 3 to 6. FIG. 3 is a view illustrating an example of the magnetic field generated in the plasma processing space. FIG. 4 is a view illustrating an example of a set of electromagnets to be subjected to a polarity modification, when viewed from the lower surface of a shower head. In FIG. 4, the electromagnets 50 are illustrated in a penetrating manner.

As illustrated in FIG. 3, in the plasma processing apparatus 1, for example, the magnetic pole of the electromagnet 50 of the central facing group 51 on the side of the plasma processing space 10s is set to the N pole, and the magnetic pole of each electromagnet 50 of the peripheral facing group 52 and the outer facing group 53 on the side of the plasma processing space 10s is set to the S pole. Then, a magnetic field B is generated radially from the central facing group 51 toward the peripheral facing group 52 or the outer facing group 53. At this time, since an electric field E is being generated in the plasma processing space 10s, electrons in the plasma processing space 10s drift by the Lorentz force caused from the electric field E and the magnetic field B. Specifically, the electric field E is generated from outside toward inside in FIG. 4, and the magnetic field B is generated radially around the center of the shower head 13 (the upper electrode). Then, according to Fleming's left hand rule, the electrons are accelerated in the normal direction of the circumference of a circle concentric with the center of the shower head 13 (the upper electrode), and revolve along a circular electron track D. The revolving electrons collide with molecules or atoms of a processing gas in the plasma processing space 10s, thereby generating plasma. As a result, annular plasma is generated along the circular electron track D.

Here, when the intensity of the magnetic field B is enhanced by controlling a specific electromagnet 50, the speed of the drift motion of the electrons decreases, and the electron density increases at the location corresponding to the specific electromagnet 50. That is, when comparing the electron density (Ne) to a tablecloth, an unevenness may be formed at the position of each electromagnet 50 (variation of sheath thickness), so that an arbitrary angle and inclination of direction of ions may be locally achieved. That is, the incident angle of ions based on the distribution of electron density may be controlled by the electromagnets 50. Further, the plasma density increases at the location where the electron density increases, because the opportunity of collision between the electrons and the molecules or atoms of the processing gas increases at the location.

In order to control the electron density within the plane of the substrate W (two-dimensional), the plurality of electromagnets 50 may be divided in the radial direction and the azimuthal direction, and the electron density may be controlled by phase differences. As a result, the normal direction (incident angle) of ions may be caused to precess. Thus, in the present embodiment, for example, a set 80 of adjacent electromagnets 50 is provided, including the electromagnet 50 of the central facing group 51 and its adjacent electromagnet 50 of the peripheral facing group 52. Further, for example, a set 81 of multiple electromagnets 50 adjacent to one electromagnet 50 is provided, including the electromagnets 50 of the peripheral facing group 52 and the electromagnets 50 of the outer facing group 53. A plurality of sets 80 and a plurality of sets 81 are provided circumferentially. The sets 80 and 81 may be provided individually, or either one of the sets 80 and 81 may be provided. Since the number of the plurality of electromagnets 50 illustrated in FIG. 4 is an example, the electromagnets 50 may be arranged throughout the shower head 13 such that any adjacent electromagnets 50 may make up the set 80, and multiple electromagnets 50 to which any one electromagnet 50 is adjacent may make up the set 81. Then, in order to control the electron density by phase differences, the polarities of the electromagnets 50 in each of the multiple sets 80 and 81 are modified.

Figure 5:
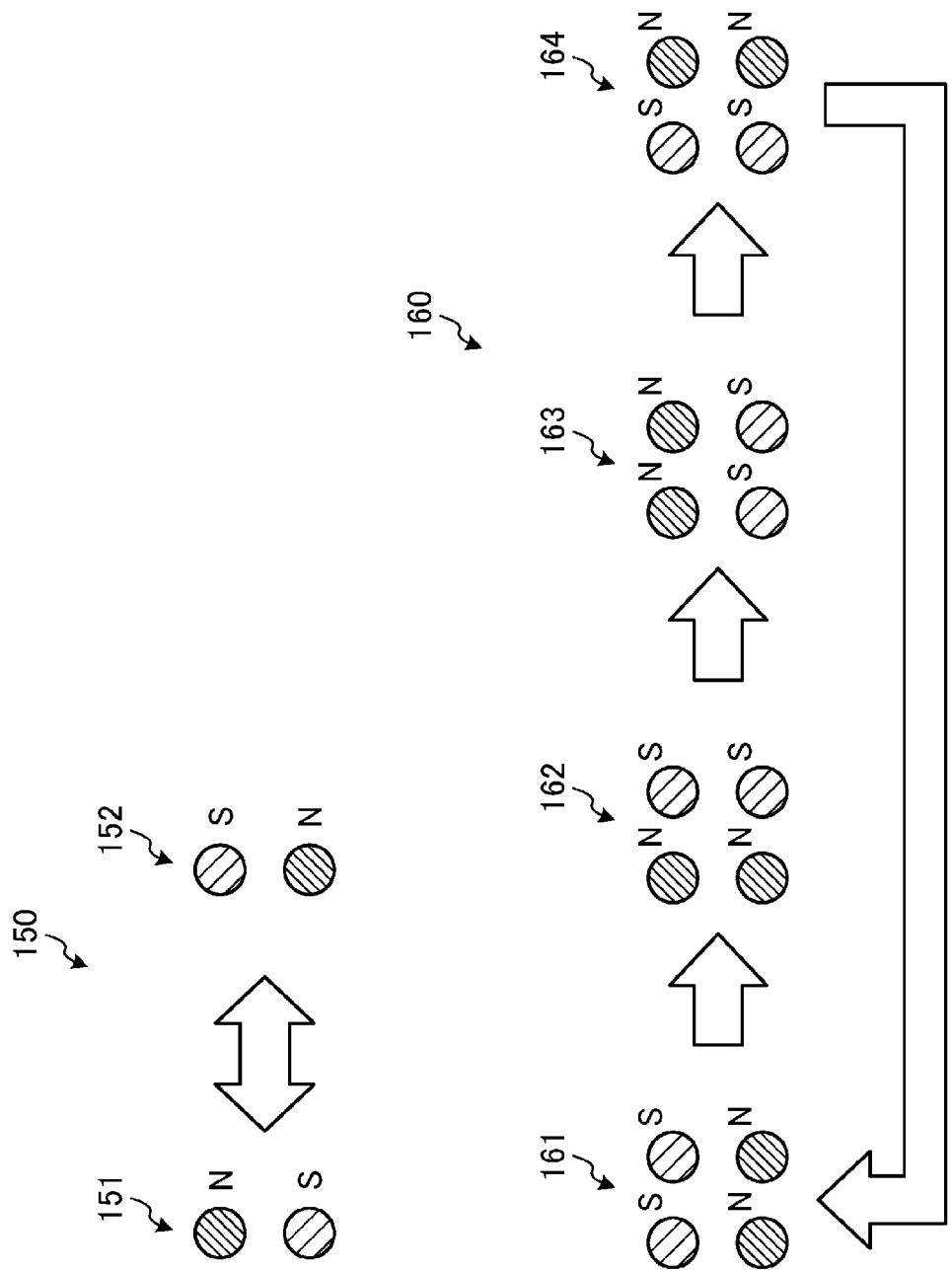
FIG. 5 is a view illustrating an example of polarity modification patterns of electromagnets.

FIG. 5 is a view illustrating an example of polarity modification patterns of the electromagnets. Similar to FIG. 4, FIG. 5 illustrates the polarities when viewed from the lower surface of the shower head 13. In FIG. 5, polarity modification patterns 150 and 160 are examples of polarity modification patterns corresponding to the sets 80 and 81 of electromagnets 50 described above, respectively. The polarity modification pattern 150 is a pattern that repeats a state 151 where one of the adjacent electromagnets of the set 80 is the N pole and the other is the S pole, and a state 152 where the N and S poles are switched to each other. That is, the polarity modification pattern 150 is an example of a pattern that alternately modifies the polarities of adjacent electromagnets 50 among the plurality of electromagnets 50.

The polarity modification pattern 160 is a pattern that sets the same polarity for two adjacent electromagnets among the four electromagnets 50 of the set 81, and modifies the polarity to rotate. In a state 161 of the polarity modification pattern 160, the two upper electromagnets 50 in FIG. 5 are the S poles, and the two lower electromagnets 50 are the N poles. In a state 162, the two right electromagnets 50 in FIG. 5 are the S poles, and the two left electromagnets 50 are the N-poles. In a state 163, the two lower electromagnets 50 in FIG. 5 are the S poles, and the two upper electromagnets 50 are the N poles. In a state 164, the two left electromagnets 50 in FIG. 5 are the S poles, and the two right electromagnets 50 are the N poles. That is, the polarity modification pattern 160 is a pattern that repeats the states 161 to 164. In other words, the polarity modification pattern 160 is an example of a pattern that alternately modifies some of the polarities of the electromagnets 50 in the set of multiple electromagnets 50 to which one electromagnet 50 is adjacent, among the plurality of electromagnets 50.

The polarity modification patterns of the electromagnets 50 may be different for each of the plurality of regions obtained by dividing the plane of the shower head 13 (the upper electrode) in the radial direction and the azimuthal direction. For example, the plane of the shower head 13 may be radially divided into three regions, that is, a center region, a middle region, and an edge region, such that the polarity of the center region may be modified using the polarity modification pattern 150, and the polarities of the middle and edge regions may be modified using the polarity modification pattern 160. For the azimuth direction as well, the polarities of divided regions may be modified using different polarity modification patterns.

In the polarity modification patterns 150 and 160, the period for alternately switching the polarities of the electromagnets 50 is, for example, a time amounting to 10% or less of an etching time. This is intended to conform the period to the etching speed of the sidewall, which is slower than the etching speed in the depth direction. For example, when the etching time is 5 minutes to 20 minutes, the polarities of the electromagnets 50 are switched in the period of 10 seconds to 120 seconds.

The period for alternately switching the polarities of the electromagnets 50 may be set to lengthen, for example, in proportion to the etching time. Since the etching rate decreases as the etching becomes deeper, the etching may be more vertically performed by lengthening the period. Further, the magnitude of a set current value of each electromagnet 50 may be set to increase in proportion to the etching time, that is, as the etching progresses. By increasing the angle of the normal direction of incident ions, that is, the inclination of the axis of the precession as the etching becomes deeper, the etching may be more vertically performed.

The polarity modification of each electromagnet 50 based on the polarity modification patterns 150 and 160 starts after a predetermined time elapses from the start of a processing with plasma. This is because the incident angle of ions is caused to precess after the opening of the mask becomes the facet shape, so as to suppress the formation of uneven CD-expanded areas.

Figure 6:
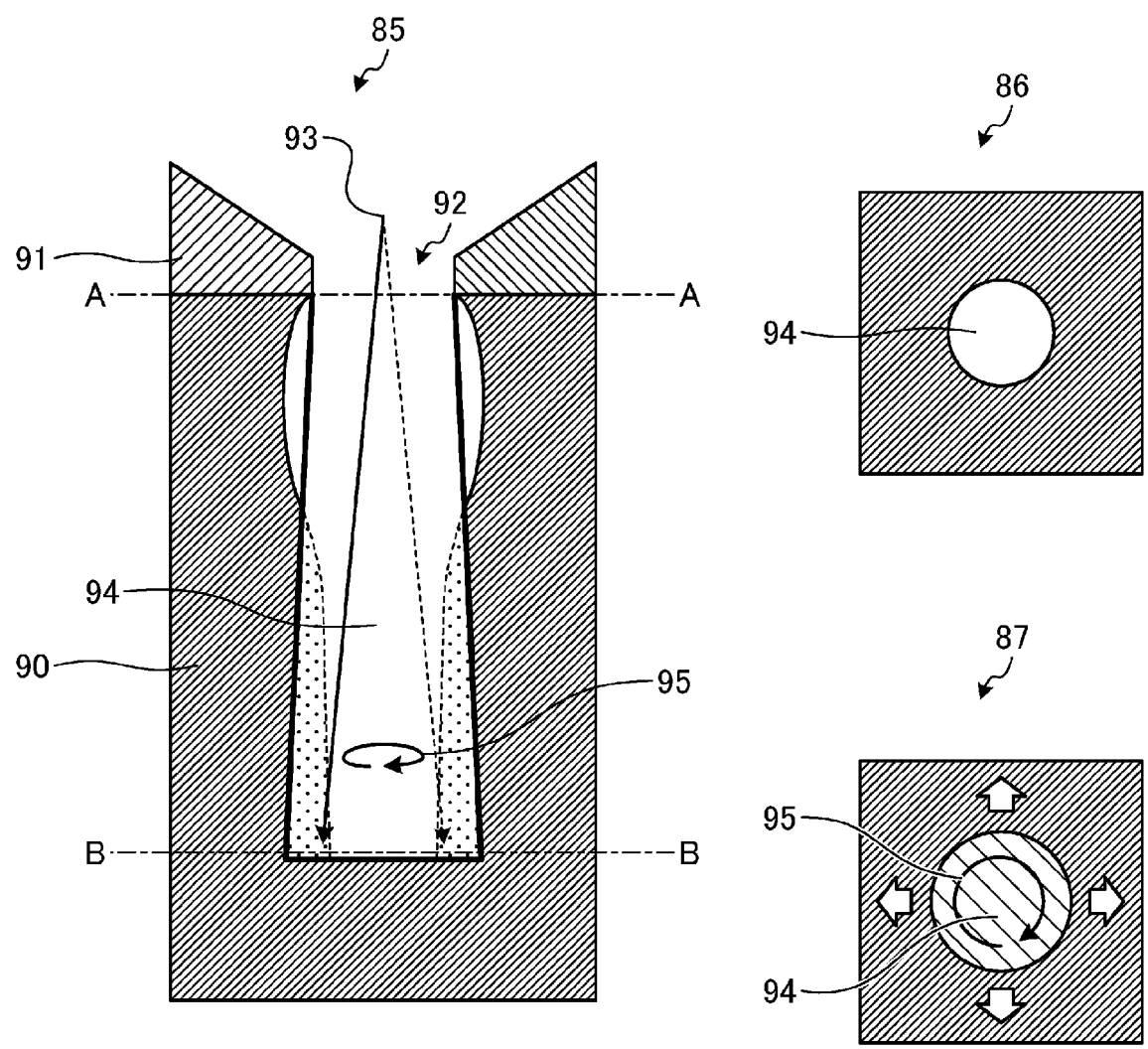
FIG. 6 is a view illustrating an example of a direction of expansion of a hole caused from the precession of an incident angle of ions.

FIG. 6 is a view illustrating an example of the expansion direction of a hole resulting from the precession of the incident angle of ions. In FIG. 6, a state 85 represents a case where an etching is performed on an etching target film 90 while modifying the polarities of the electromagnets 50 according to, for example, the polarity modification patterns 150 and 160 in the middle and later stages of the etching. The A-A cross section (top) of the state 85 is represented as a cross section 86, and the B-B cross section (bottom) of the state 85 is represented as a cross section 87. Here, the etching target film 90 may be, for example, a stacked film of an oxide film and a nitride film, or a stacked film of an oxide film and a silicon film. That is, a hole 94 is formed in the stacked film by the etching. It is assumed that the aspect ratio of the hole 94 is 30 or more.

In the state 85, a mask 91 already has the facet shape. At this time, the polarity of each electromagnet 50 is controlled to cause the trajectory of ions 93 incident into the hole 94 from the opening 92 to precess as indicated by a trajectory 95. As a result, when the planar direction of the substrate W is defined by X and Y axes, and the depth direction is a Z axis, the cross section of the hole 94 in the cross section 87 is evenly enlarged in the XY direction. Further, by performing the precession of the trajectory of the ions 93 as illustrated in FIG. 6, the size of the hole 94 in the cross section 87 may be made larger (inverse tapered shape) than the hole 94 in the cross section 86.

[Etching Method]

Figure 7:
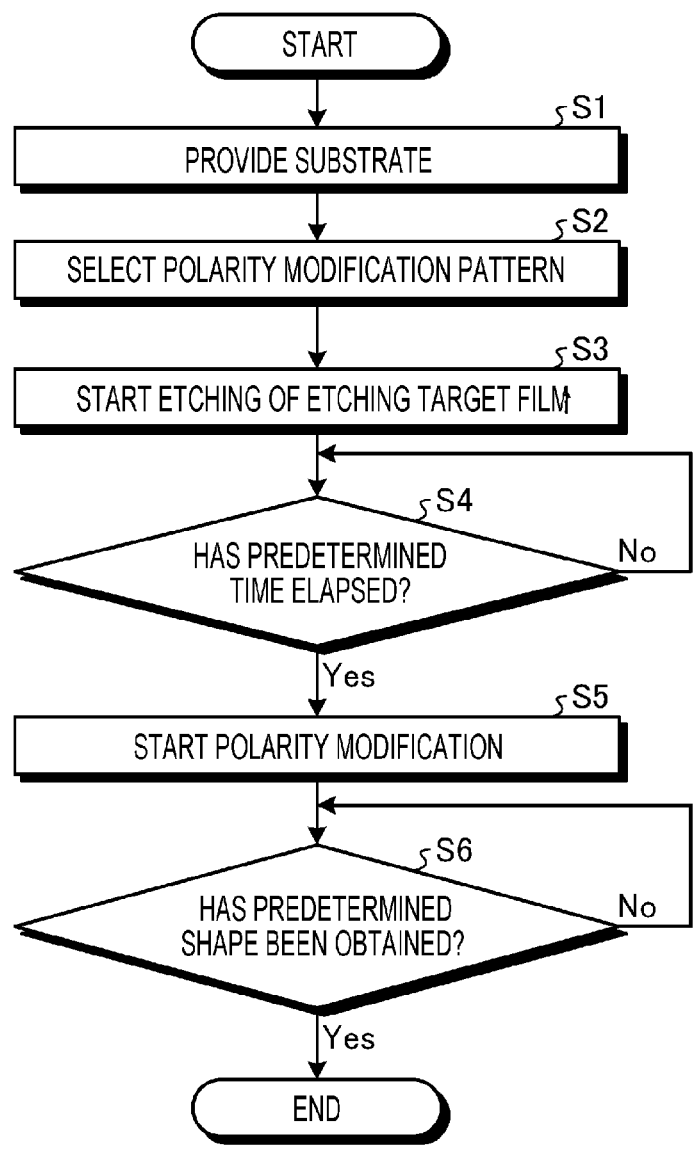
FIG. 7 is a flowchart illustrating an example of an etching process in the embodiment.

Next, an etching method according to an embodiment of the present disclosure will be described. FIG. 7 is a flowchart illustrating an example of an etching process in the embodiment.

In the etching method according to the embodiment, the control unit 2 opens an opening (not illustrated) such that a substrate W with an etching target film formed thereon, is carried into the plasma processing chamber 10, and placed on the central region 111a of the substrate support 11. The substrate W is held on the electrostatic chuck 1111 as a DC voltage is applied to the electrostatic chuck 1111. Then, the control unit 2 closes the opening, and controls the exhaust system 40 to exhaust a gas from the plasma processing space 10s until the atmosphere of the plasma processing space 10s reaches a predetermined vacuum level. Further, the control unit 2 controls the temperature control module (not illustrated) such that the temperature of the substrate W is adjusted to a predetermined temperature (step S1).

Next, the control unit 2 selects the polarity modification pattern to be used for each electromagnet 50 during an etching (step S2). For example, the control unit 2 may select the polarity modification pattern by reading a polarity modification pattern stored in advance with a recipe for an etching process, or may accept a selection of a polarity modification pattern from an operator of the plasma processing system.

Subsequently, the control unit 2 controls the gas supply unit 20 to supply a processing gas to the gas supply port 13a. The processing gas is introduced from the gas supply port 13a into the plasma processing space 10s of the plasma processing chamber 10 through the gas diffusion chamber 13b and the plurality of gas introduction ports 13c.

The control unit 2 controls the first RF generation unit 31a to supply a source RF signal for a plasma excitation to the substrate support 11 including the lower electrode. In the plasma processing space 10s, plasma is generated by the supply of the source RF signal for the plasma excitation. The control unit 2 controls the second RF generation unit 31b to supply a bias RF signal to the substrate support 11 including the lower electrode. The etching target film of the substrate W is etched by the plasma generated in the plasma processing space 10s. That is, the control unit 2 controls the first RF generation unit 31a and the second RF generation unit 31b to start the etching of the etching target film of the substrate W (step S3).

Based on the recipe for the etching process, the control unit 2 determines whether a predetermined time has elapsed (step S4). Here, the predetermined time is a time when and after the depth of a shape formed by the etching reaches the middle of the target depth. That is, the control unit 2 determines whether the etching has entered the middle and later stages. When it is determined that the predetermined time has not elapsed (step S4: No), the control unit 2 continues the etching and the determination of step S4.

When it is determined that the predetermined time has elapsed (step S4: Yes), the control unit 2 controls each electromagnet 50 based on the selected polarity modification pattern, and starts modifying the polarity of each electromagnet 50 (step S5). Even though the polarity modification starts, the etching with the plasma continues.

The control unit 2 determines whether a predetermined shape has been obtained by the etching process (step S6). Whether the predetermined shape has been obtained is determined according to, for example, the elapse of a predetermined process time based on the recipe. When it is determined that the predetermined shape has not been obtained (step S6: No), the control unit 2 continues the etching and the determination of step S6. Meanwhile, when it is determined that the predetermined shape has been obtained (step S6: Yes), the control unit 2 terminates the process.

When the process is terminated, the control unit 2 controls the first RF generation unit 31a and the second RF generation unit 31b to stop the supply of the RF signals to the lower electrode. The control unit 2 opens the opening (not illustrated). The substrate W is carried out of the plasma processing space 10s of the plasma processing chamber 10 through the opening.

According to the embodiment above, the substrate processing apparatus (the plasma processing system) includes a chamber (the plasma processing chamber 10), the substrate support 11 configured to support the substrate W in the chamber, an upper electrode (the shower head 13) facing the center of the substrate W, the plurality of electromagnets 50 arranged radially around the center of the upper electrode, and the control unit 2. The control unit 2 is configured to control the substrate processing apparatus to select the polarity modification pattern 150 or 160 to be used for the plurality of electromagnets 50 during the etching. Further, the control unit 2 is configured to control the substrate processing apparatus to generate plasma from the processing gas supplied into the chamber, and etch the substrate W based on the selected polarity modification pattern. As a result, the formation of uneven CD-expanded areas may be suppressed even in the middle and later stages of the etching.

According to the present embodiment, the polarity modification pattern is a pattern that alternately modifies the polarities of adjacent electromagnets 50 among the plurality of electromagnets 50. As a result, the normal direction (incident angle) of ions may be caused to precess.

According to the present embodiment, the polarity modification pattern is a pattern that alternately modifies some of the polarities of electromagnets 50 in the set of multiple electromagnets 50 adjacent to one electromagnet 50, among the plurality of electromagnets 50. As a result, the normal direction (incident angle) of ions may be caused to precess.

According to the present embodiment, the polarity modification pattern is set differently for each region within the plane of the upper electrode. As a result, the precession of the normal direction (incident angle) of ions may be controlled for each region in the plane of the upper electrode.

According to the present embodiment, the period for the alternate modification is a time of 10% or less of the etching time. As a result, the formation of uneven CD-expanded areas may be suppressed even in the middle and later stages of the etching process.

According to the present embodiment, the period lengthens in proportion to the etching time. As a result, the etching may be performed more vertically.

According to the present embodiment, the magnitude of a set current value for the plurality of electromagnets 50 increases in proportion to the etching time. As a result, the inclination of the axis of the precession of incident ions may be increased as the etching becomes deeper.

According to the present embodiment, in the etching process, the modification of the polarities of the plurality of electromagnets 50 based on the polarity modification pattern is performed after a predetermined time elapses from the start of the processing with plasma. As a result, the formation of uneven CD-expanded areas may be suppressed even in the middle and later stages of the etching process.

According to the present embodiment, the predetermined time is a time when and after the depth of the shape by the etching reaches the middle of a target depth. As a result, the formation of uneven CD-expanded areas may be suppressed even in the middle and later stages of the etching process.

According to the present embodiment, the shape by the etching has an aspect ratio of 30 or more. As a result, the formation of uneven CD-expanded areas may be suppressed in the shape of a hole, a groove, or the like with the high aspect ratio.

According to the present embodiment, the shape by etching is formed on a stacked film of an oxide film and a nitride film or a stacked film of an oxide film and a silicon film, which is formed on the substrate W. As a result, the formation of uneven CD-expanded areas may be suppressed in the etching of the stacked film.

In the embodiment described above, the electromagnet 50 with the rod-like yoke 50a made of an iron core is used. However, the present disclosure is not limited thereto. For example, an electromagnet with an air-core coil may be used.

In the embodiment above, for example, the plasma processing apparatus 1 has been described, which performs a processing such as etching on the substrate W using capacitively coupled plasma as a plasma source. However, the present disclosure is not limited thereto. Without being limited to the capacitively coupled plasma, any plasma source, such as inductively coupled plasma, microwave plasma, or magnetron plasma, may be used as long as the apparatus may perform a processing on the substrate W using the plasma. For example, when the inductively coupled plasma is used, the electromagnets 50 may be arranged on the back surface of the electrostatic chuck 111 in the substrate support 11, to form the in-plane distribution of the electron density (Ne) as in the embodiment described above. Further, for example, when the inductively coupled plasma is used, a plurality of induction coils may be controlled in combination, to form the in-plane distribution of the electron density.

The present disclosure may have the following configuration:

(1) A substrate processing method comprising:
providing a substrate processing apparatus including
a chamber,
a substrate support configured to support a substrate in the chamber,
an upper electrode facing a center of the substrate, and
a plurality of electromagnets arranged radially around the center of the upper electrode;
selecting a polarity modification pattern to be used for the plurality of electromagnets during an etching; and
generating plasma from a processing gas supplied into the chamber, and etching the substrate based on the polarity modification pattern.

(2) The substrate processing method of (1) above, wherein the polarity modification pattern alternately modifies polarities of adjacent electromagnets among the plurality of electromagnets.

(3) The substrate processing method of (1) above, wherein the polarity modification pattern alternately modifies a portion of polarities of electromagnets in a set of multiple electromagnets adjacent to one electromagnet among the plurality of electromagnets.

(4) The substrate processing method of (1) above, wherein the polarity modification pattern is set differently for each region within a plane of the upper electrode.

(5) The substrate processing method of (2) or (3) above, wherein a time period for alternately modifying the polarities is 10% or less of an etching time.

(6) The substrate processing method of (5) above, wherein the period lengthens in proportion to the etching time.

(7) The substrate processing method of (5) or (6) above, wherein a magnitude of a set current value for the plurality of electromagnets increases in proportion to the etching time.

(8) The substrate processing method of any one of (1) to (7) above, wherein in the etching, polarities of the plurality of electromagnets are modified based on the polarity modification pattern, after a predetermined time elapses from a start of a processing with the plasma.

(9) The substrate processing method of (8) above, wherein the predetermined time is a time when and after a depth of a shape formed by the etching reaches a middle of a target depth.

(10) The substrate processing method of (9) above, wherein the shape formed by the etching has an aspect ratio of 30 or more.

(11) The substrate processing method of (10) above, wherein the shape formed by the etching is formed in a stacked film of an oxide film and a nitride film formed on the substrate, or a stacked film of an oxide film and a silicon film formed on the substrate.

(12) A substrate processing apparatus comprising:
a chamber;
a substrate support configured to support a substrate in the chamber;
an upper electrode facing a center of the substrate;
a plurality of electromagnets arranged radially around the center of the upper electrode; and
a controller,
wherein the controller is configured to control the substrate processing apparatus
to select a polarity modification pattern to be used for the plurality of electromagnets during an etching, and
to etch the substrate based on the polarity modification pattern.

According to the present disclosure, it is possible to suppress the formation of uneven CD-expanded areas even in middle and later stages of an etching.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing method comprising:
providing a substrate processing apparatus including
a chamber,
a substrate support configured to support a substrate in the chamber,
an upper electrode facing a center of the substrate, and
a plurality of electromagnets arranged radially around the center of the upper electrode;
selecting a polarity modification pattern to be used for the plurality of electromagnets during an etching; and
generating plasma from a processing gas supplied into the chamber, and etching the substrate based on the polarity modification pattern,
wherein in the etching, polarities of the plurality of electromagnets are modified based on the polarity modification pattern, after a predetermined time elapses from a start of a processing with the plasma.

2. The substrate processing method according to claim 1, wherein the polarity modification pattern alternately modifies polarities of adjacent electromagnets among the plurality of electromagnets.

3. The substrate processing method according to claim 2, wherein a time period for alternately modifying the polarities is 10% or less of an etching time.

4. The substrate processing method according to claim 3, wherein the time period lengthens in proportion to the etching time.

5. The substrate processing method according to claim 3, wherein a magnitude of a set current value for the plurality of electromagnets increases in proportion to the etching time.

6. The substrate processing method according to claim 1, wherein the polarity modification pattern alternately modifies a portion of polarities of electromagnets in a set of multiple electromagnets adjacent to one electromagnet among the plurality of electromagnets.

7. The substrate processing method according to claim 6, wherein a time period for alternately modifying the polarities is 10% or less of an etching time.

8. The substrate processing method according to claim 7, wherein the time period lengthens in proportion to the etching time.

9. The substrate processing method according to claim 7, wherein a magnitude of a set current value for the plurality of electromagnets increases in proportion to the etching time.

10. The substrate processing method according to claim 1, wherein the polarity modification pattern is set differently for different regions within a plane of the upper electrode.

11. The substrate processing method according to claim 1, wherein the predetermined time is a time when and after a depth of a shape formed by the etching reaches a middle of a target depth.

12. The substrate processing method according to claim 11, wherein the shape formed by the etching has an aspect ratio of 30 or more.

13. The substrate processing method according to claim 12, wherein the shape formed by the etching is formed in a stacked film of an oxide film and a nitride film formed on the substrate, or a stacked film of an oxide film and a silicon film formed on the substrate.

14. A substrate processing apparatus comprising:
a chamber;
a substrate support configured to support a substrate in the chamber;
an upper electrode facing a center of the substrate;
a plurality of electromagnets arranged radially around the center of the upper electrode; and
a controller configured to control the substrate processing apparatus to perform
selecting a polarity modification pattern to be used for the plurality of electromagnets during an etching, and
etching the substrate based on the polarity modification pattern,
wherein in the etching, polarities of the plurality of electromagnets are modified based on the polarity modification pattern, after a predetermined time elapses from a start of a processing with plasma.

15. A substrate processing method comprising:
providing a substrate processing apparatus including
a chamber,
a substrate support configured to support a substrate in the chamber,
an upper electrode facing a center of the substrate, and
a plurality of electromagnets arranged radially around the center of the upper electrode;
selecting a polarity modification pattern to be used for the plurality of electromagnets during an etching; and
generating plasma from a processing gas supplied into the chamber, and etching the substrate based on the polarity modification pattern,
wherein the polarity modification pattern alternately modifies polarities of adjacent electromagnets among the plurality of electromagnets, and wherein a time period for alternately modifying the polarities is 10% or less of an etching time.

* * * * *